United States Patent
Kadura et al.

(10) Patent No.: US 10,777,701 B2
(45) Date of Patent: Sep. 15, 2020

(54) PHOTOSENSITIVE DETECTOR WITH SELF-ALIGNED 3D JUNCTION AND GATE

(71) Applicant: COMMISSARIAT A L'ENERGIE ATOMIQUE ET AUX ENERGIES ALTERNATIVES, Paris (FR)

(72) Inventors: Lina Kadura, Grenoble (FR); Laurent Grenouillet, Claix (FR); Olivier Rozeau, Moirans (FR); Alexei Tchelnokov, Meylan (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/114,324

(22) Filed: Aug. 28, 2018

(65) Prior Publication Data

US 2019/0074398 A1 Mar. 7, 2019

(30) Foreign Application Priority Data

Sep. 5, 2017 (FR) ...................... 17 58192

(51) Int. Cl.
*H01L 31/113* (2006.01)
*H01L 27/12* (2006.01)
(Continued)

(52) U.S. Cl.
CPC ...... *H01L 31/1136* (2013.01); *H01L 27/1207* (2013.01); *H01L 27/14616* (2013.01); *H01L 27/14643* (2013.01); *H01L 27/14689* (2013.01); *H01L 31/035281* (2013.01); *H01L 31/1804* (2013.01); *H01L 31/0288* (2013.01)

(58) Field of Classification Search
CPC ............ H01L 31/1136; H01L 31/1804; H01L 31/035281; H01L 31/0288; H01L 27/14689; H01L 27/14643; H01L 27/14616; H01L 27/1207
See application file for complete search history.

(56) References Cited

U.S. PATENT DOCUMENTS 7,749,874 B2 7/2010 Drowley et al.
8,319,307 B1 11/2012 Williams
(Continued)

FOREIGN PATENT DOCUMENTS

| EP | 2 479 785 A1 | 7/2012 |
| EP | 2 587 539 A1 | 5/2013 |
| EP | 2 947 689 A2 | 11/2015 |

OTHER PUBLICATIONS

French Preliminary Search Report dated Jun. 7, 2018 in French Application 17 58192 filed Sep. 5, 2017 (with English Translation of Categories of Cited Documents).

(Continued)

*Primary Examiner* — Marcos D. Pizarro
*Assistant Examiner* — Sue Tang
(74) *Attorney, Agent, or Firm* — Oblon, McClelland, Maier & Neustadt, L.L.P.

(57) ABSTRACT

A photosensitive transistor device, on a semiconductor on insulator substrate, the photosensitive zone being formed in a substrate support layer and being arranged so that the concentration of photogenerated charges in the photosensitive zone can be increased towards a given zone facing the channel zone of the transistor.

10 Claims, 9 Drawing Sheets

(51) Int. Cl.
*H01L 27/146* (2006.01)
*H01L 31/0352* (2006.01)
*H01L 31/18* (2006.01)
*H01L 31/0288* (2006.01)

(56) References Cited

U.S. PATENT DOCUMENTS

| | | | |
|---|---|---|---|
| 8,324,002 B2 | 12/2012 | Hsu et al. | |
| 2006/0006489 A1 | 1/2006 | Park | |
| 2007/0072325 A1 | 3/2007 | Rhodes | |
| 2007/0218578 A1* | 9/2007 | Lee | H01L 27/14647 |
| | | | 438/48 |
| 2009/0001494 A1 | 1/2009 | Park et al. | |
| 2011/0006328 A1* | 1/2011 | Surdeanu | H01L 25/167 |
| | | | 257/98 |
| 2015/0338720 A1* | 11/2015 | Grenouillet | H01L 27/1203 |
| | | | 359/108 |

OTHER PUBLICATIONS

R. Tsuchiya, et al., "Silicon on thin BOX: A New Paradigm of the CMOSFET for Low-Power and High-Performance Application Featuring Wide-Range Back-Bias Control," IEEE 2004, 4 Pages.

L. Kadura, et al., "Extending the Functionality of FDSOI N- and P-FETs to Light Sensing," IEEE 2016, 4 Pages.

U.S. Appl. No. 15/335,123, filed Oct. 26, 2016, US-2017-0125458-A1, Oliver Rozeau, et al.

U.S. Appl. No. 15/711,549, filed Sep. 21, 2017, US-2018-0082837-A1, Shay Reboh, et al.

U.S. Appl. No. 15/918,023, filed Mar. 12, 2018, Vincent Mazzocchi, et al.

* cited by examiner

PHOTOSENSITIVE DETECTOR WITH SELF-ALIGNED 3D JUNCTION AND GATE

TECHNICAL DOMAIN AND PRIOR ART

This invention relates to the field of photo-detection and imagery and applies to the use of an improved photo-detection device on a semiconductor on insulator substrate.

In the technical field of photosensitive devices, document EP 2°587°539 presents a microelectronic device formed from a transistor made on a semiconductor on insulator type support for which the threshold voltage can be modulated as a function of a quantity of photons received by a photosensitive zone located in the semiconducting support layer of the substrate. The photosensitive zone is separated from the transistor channel zone by the insulating layer of the substrate. The transistor threshold voltage can be varied as a result of capacitive coupling set up between the photosensitive zone and the channel zone of the transistor. Thus, when there is no light radiation to be detected, the threshold voltage of the transistor is equal to a value $Vt_1$, and when light radiation is received, the threshold voltage of the transistor is equal to a value $Vt_2$ different from $Vt_1$. Such a threshold voltage variation originates from an accumulation of photogenerated charges close to the interface between the support layer and the insulating layer of the substrate.

The problem that arises is to improve the detection sensitivity of such a type of photosensitive microelectronic device.

PRESENTATION OF THE INVENTION

An embodiment applies to a photosensitive device comprising a semiconductor on insulator substrate on which at least one transistor bears, the substrate being provided with a surface semiconducting layer in which a channel zone of said transistor is arranged, an insulating layer separating the surface semiconducting layer from a semiconducting support layer, the semiconducting support layer comprising a photosensitive zone formed from regions doped with at least one first doping type (N or P) and at least one second doping type (P or N) so as to form at least one junction, the insulating layer being configured so as to enable capacitive coupling between the photosensitive zone and the transistor channel zone, the doped regions forming the junction being arranged relative to a given zone of the support layer located in contact with the insulating layer and facing the channel zone of the transistor, so as to concentrate photogenerated charges in the support layer in parts located facing the source and drain zones towards this given zone.

In particular, the junction can be formed from a superposition of doped regions with a 3D or non-planar profile, distributed around said given zone in concentric regions.

According to an embodiment, the photosensitive zone comprises the following among said doped regions:
a first region doped with a first type of doping (N or P), the first doped region being arranged in contact with the insulating layer and facing the channel zone,
a second region doped with a second type of doping (P or N), the second doped region being arranged around the first doped region and extending in contact with the insulating layer and facing the source and drain zones.

Thus, one or several horizontal PN or NP or PIN or NIP junctions or parts of junctions are formed, in other words junctions said to be parallel to the principal plane of the substrate and configured so as to bring photogenerated charges into the support layer facing the source and drain zones to a given zone in the support layer locating facing the channel zone. This improved concentration of photogenerated charges facing the channel can increase the detection sensitivity of the device.

Preferably, the second doped region also extends under the first doped region such that facing the channel zone, the first doped region is located between the insulating layer and the second doped region. In this case, the photosensitive zone comprises a PN or NP or PIN or NIP junction or portion of junction with a vertical arrangement.

Advantageously, the transistor channel zone is entirely facing the first doped region.

Advantageously, in a cross section of the support layer, the first doped region is entirely surrounded by said second doped region. The given zone of the support layer facing the channel is thus entirely surrounded by a PN or NP or PIN or NIP junction.

Preferably, a slightly doped intermediate region is located between said first doped region and said second doped region, so as to form a PIN or NIP type junction.

Advantageously, the first doped region, the intermediate region and the second doped region form a PIN or NIP type junction and are distributed concentrically around the given zone of the support layer entirely located facing the transistor channel zone and in contact with the insulating layer.

A first region slightly wider than the length of the transistor gate can be provided to make the device even more sensitive.

The first doped region can thus be delimited laterally by lateral edges facing insulating spacers arranged in contact with the gate.

Another aspect of this invention relates to a method of making the photosensitive zone with a non-planar or 3D layout of the doped regions.

An embodiment of the method of implementing a photosensitive zone for a device like that defined above starts from a substrate in which the substrate support layer is doped with a second doping type (P or N) and includes steps to:
make a sacrificial gate and a mask around the sacrificial gate, on the substrate,
remove the sacrificial gate so as to form an opening surrounded by the mask,
implantation through the opening, so as to dope a portion of the support layer facing the opening, with the first N or P type doping.

The dimensions of the doped portion thus advantageously depend on the dimensions of the sacrificial gate. Then, if a replacement gate is formed in the opening, the dimensions of the doped portion also depend on the dimensions of the replacement gate. Said doped portion typically corresponds to the first doped region of the device defined above.

Another embodiment includes a method of implementing the photosensitive zone for a photosensitive device like that defined above starting from a substrate in which the substrate support layer is doped with a second doping type (P or N), the method including steps to:
make implantations inclined, at an angle $\alpha_1$ and an angle $-\alpha_2$ respectively from a given plane orthogonal to the principal plane of the substrate, so as to apply a first type of doping to a first portion of the support layer facing the gate,
make an implantation parallel to the given plane so as apply a second type of doping to second portions of the support layer on each side of the first portion. $\alpha_1$ and $\alpha_2$ are non-zero and typically equal angles.

Another embodiment of the method of making the photosensitive zone in which a transistor gate is formed on the semiconductor on insulator substrate, the support layer of the substrate being doped with the second type of doping, for example of the P type, includes:

first implantations inclined by angles $\alpha_1$ and $-\alpha_1$ respectively from a given plane orthogonal to the principal plane of the substrate, so as to dope a portion of the substrate layer under the gate with a first type of doping, for example the N type, second implantations inclined by angles $\alpha_2$, $-\alpha_2$ respectively such that $\alpha_2 < \alpha_1$ from a given plane so as to increase the depth of said doped portion with a first type of doping.

Another embodiment of the method in which the support layer is initially doped with the second type of doping, for example the P type, includes the following steps:

implantation so as to dope an upper underlayer of the support layer with a first type of doping, then formation of a gate, then, implantation on each side of the gate, so as to dope portions of the support layer located on each side of a central portion located facing the gate, with the second type of doping.

Advantageously, after implantation of the portions, a masking layer is formed in contact with the flanks of the gate, and then at least one new implantation is made on each side of the gate so as to increase the second type of doping of some parts of said portions.

BRIEF DESCRIPTION OF THE DRAWINGS

This invention will be better understood after reading the description of example embodiments given purely for information and that are in no way limitative, with reference to the appended drawings on which.

Identical, similar or equivalent parts of the different figures have the same numeric references to facilitate the comparison between the different figures.

The different parts shown on the figures are not necessarily all at the same scale, to make the figures more easily understandable.

DETAILED PRESENTATION OF PARTICULAR EMBODIMENTS

FIGS. 2 and 3A-3C illustrate an example of a photosensitive device fabricated according to an embodiment of this invention.

The device is provided with a transistor $T_1$ coupled to a photosensitive zone 20.

The transistor $T_1$ is formed on a semiconductor on insulator type substrate and comprises a semiconducting support layer 10, an insulating layer 11 supported on a "front face" of the support layer 10, and a surface semiconducting layer 12 supported on the insulating layer 11 and in which the channel zone of the first transistor $T_1$ is arranged.

The substrate may for example be of the SOI (Silicon on Insulator) type while transistor $T_1$ is typically a MOS (Metal Oxide Semi-conductor) transistor and may for example be made using the FDSOI (Fully Depleted Silicon On Insulator) type technology. The device is typically provided with isolation trenches 31, for example filled with silicon oxide, provided on each side of transistor $T_1$.

The photosensitive zone 20 is arranged in the support layer 10 and is separated from the channel 14 of the transistor $T_1$ through the insulating layer 11 of the support. This insulating layer 11 is designed (particularly by its composition and thickness) so that a capacitive coupling, also called electrostatic coupling, can be set up between the photosensitive zone and the channel zone 14 of the transistor. An example embodiment includes an insulating layer 11 based on $SiO_2$ with a thickness equal to between 5 nm and 50 nm, and preferably between 10 nm and 25 nm.

Figure 2:
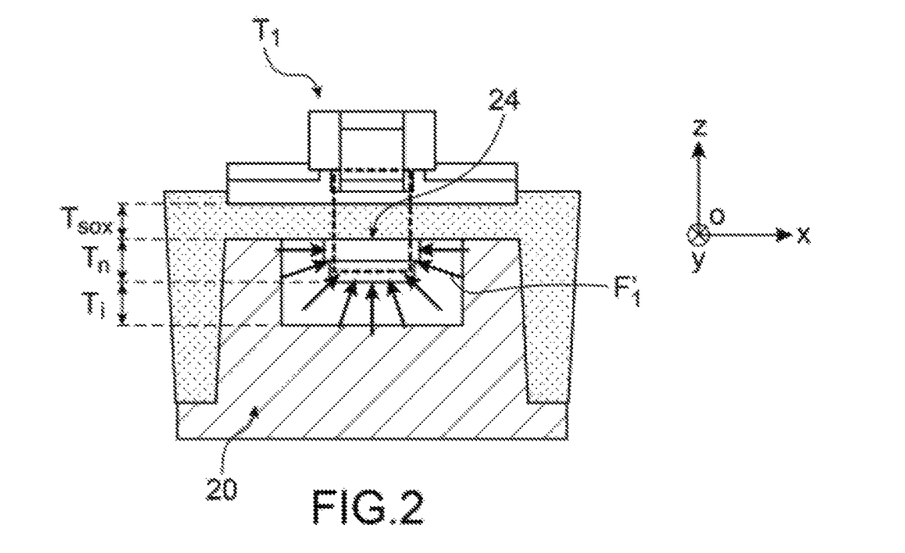
FIGS. 2, 3A-3C illustrate an example of a photosensitive device according to an embodiment of this invention provided with a transistor formed on a semiconductor on insulator support and, in the substrate support layer, a junction with a 3D arrangement so that photo-generated charges can be concentrated essentially in a given zone in the support layer facing the channel zone of the transistor.
Figure 3A:
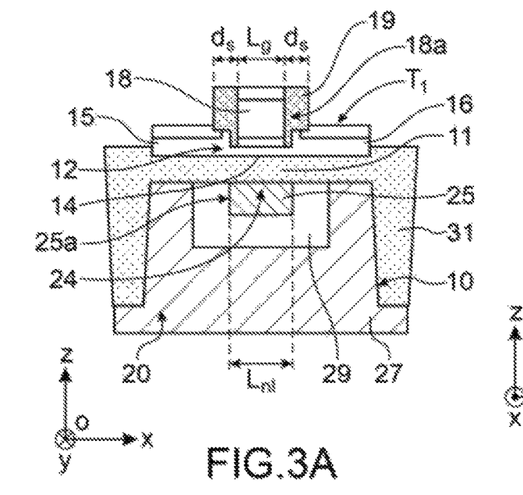
Figure 3B:
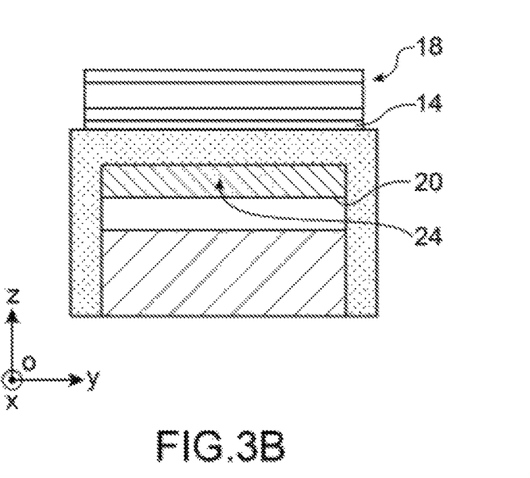
Figure 3C:
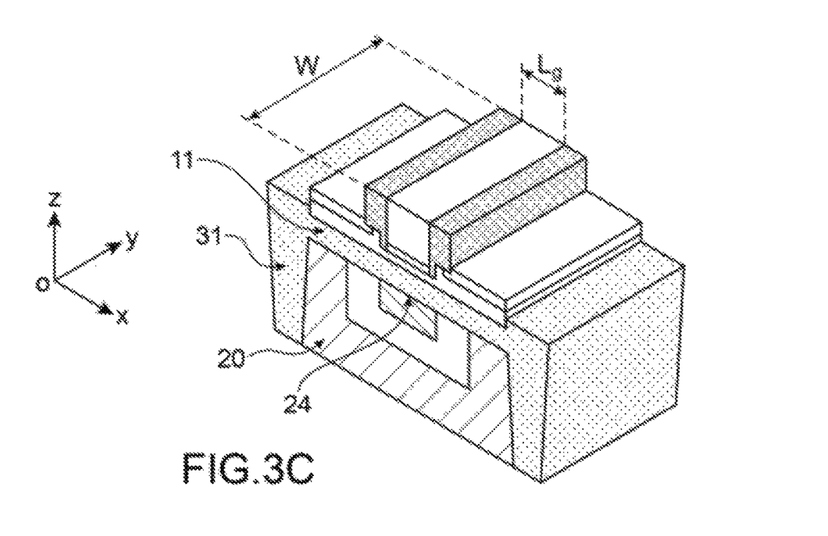

The capacitive coupling is such that a variation of the potential resulting from reception of light radiation at the photosensitive zone 20 can be used to generate variation in the LIVS (Light Induced $V_T$ Shift) of the threshold voltage $V_T$ of the transistor T.

The variation of the threshold voltage $V_T$ of transistor $T_1$, subsequent to an illumination or variation of the illumination of the photosensitive zone 20 may for example reach a value of the order of 10 mV to 250 mV.

This threshold voltage shift can be adjusted by adapting the corresponding thicknesses of the insulating layer 101 and/or the semiconducting surface layer 12, and/or the transistor gate dielectric.

A reduction in the thickness of the insulating layer 11, and/or an increase in the thickness of the surface semiconducting layer 12, and/or an increase in the thickness of the transistor gate dielectric are particularly conducive to an increase in this threshold voltage shift.

In this case, the photosensitive zone 20 is formed from a first region 25 doped with a given doping type, for example N type, and a second doped region 27 doped with another doping type opposite the first given doping type, in this example P type doping.

The photosensitive zone 20 is thus formed from at least one junction, the arrangement of which in the support layer 10 is designed so as to enable a better concentration of photogenerated charges in the support layer 10 to a given zone 24 in this layer 10 located in contact with the insulating layer 11 and placed facing the channel zone 14 of the transistor channel. In this example embodiment, this given zone 24 has a critical dimension Lnl measured in a plane parallel to the plane of the substrate equal or approximately equal to the length Lg of the gate 18 of transistor $T_1$. The "principal plane" of the substrate means a plane passing through the substrate and that is parallel to the [O; x; y] plane of the [O; x; y; z] coordinate system given on FIGS. 2A-2C and 3

"Critical dimension" means the smallest dimension of an element other than its thickness, this dimension being measured parallel to the [O; x; y] plane. The gate length Lg is a dimension of the transistor gate 18 measured parallel to an axis passing through the source region and the drain region of transistor $T_1$, this axis also being parallel to the principal plane of the substrate. Thus, the lateral edges 25a of the first doped region 25 extend as least as far as facing the lateral flanks 18a of the gate 18.

The first doped region 25 extends in contact with the insulating layer 11 facing the channel zone 14. Preferably, the transistor channel zone 14 is entirely facing the first doped region 25.

Figure 1:
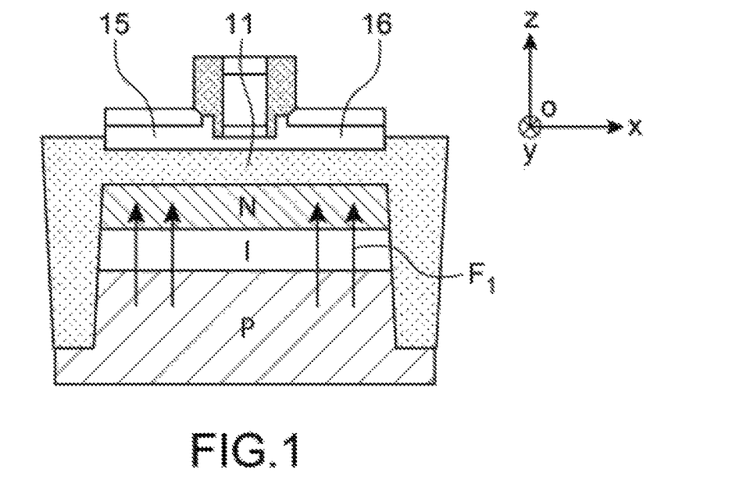
FIG. 1 illustrates a photosensitive transistor device formed on a semiconductor on insulator substrate and provided with a junction with a 2D layout facing the transistor in the substrate support layer, the junction having a 2D plane arrangement.

Unlike an arrangement qualified as "2D" of the type shown in FIG. 1, the photosensitive device illustrated on FIGS. 2 and 3A-3C has better sensitivity due to a more efficient concentration of photogenerated charges to the given zone 24 of the support layer facing the channel zone 14.

With the photosensitive device with 2D junction in FIG. 1 a uniform electric field can be set up in a plane parallel to the substrate. The photogenerated charges thus displace along an approximately vertical direction (in other words approximately orthogonal to the principal plan of the substrate). Consequently, photogenerated charges in the parts of the support layer 10 located facing the source 16 and drain 18 zones move towards other parts of the support layer 10 also located facing the source 16 and drain 18 zones but closer to the insulating layer 11. Such a displacement is diagrammatically illustrated by the arrows F1.

The improved concentration of photogenerated charges in the device according to the invention is possible due to an improved arrangement of the doped regions forming the junction.

The second doped region 27 is arranged particularly on each side of the first region 25, and extends in contact with the insulating layer 10 and facing the source 16 and drain 18 zones.

Thus, with such a distribution of the regions 25 and 27, charges photogenerated in the parts of the support layer 10 locating facing the source 16 and drain 18 zones can be displaced towards the given zone 24 of the support layer 10 that is located facing the channel zone 14 and its dimensions in a plane parallel to the plane of the substrate are equal or approximately equal to the dimensions of the gate 18 of transistor $T_1$.

Advantageously, the second doped region 27 also extends under the first doped region 25.

Thus, a non-planar or "3D" distribution of the superposition of doped regions forming the junction is preferred.

In the particular example in FIGS. 2, 3A-3C, the junction is thus distributed on 3 dimensions and more particularly such that the first doped region 25 in a cross-section of the support layer 10 (i.e. a section orthogonal to the principal plane of the substrate), is entirely surrounded by said second doped region. The given zone 24 located in contact with the insulating layer 11 facing the channel zone 14 of the transistor thus sees a junction distributed all around it. The first doped region 25 and the second doped region 27 are arranged to be concentric around the given zone 24.

In this particular embodiment, the junction has an inwards or outwards curved profile around the given zone 24 of the support layer located facing the channel zone 14, in a plane orthogonal to a principal plane of the substrate.

Due to this arrangement of the junction, it is possible to displace the photogenerated charges as shown on FIG. 2. The field components and the induced displacement are represented diagrammatically by arrows F' 1, oriented along different concentric directions not parallel to each other and directed towards the given zone 24 of the support layer located facing the channel.

The junction formed in the support layer 10 is preferably a PIN or NIP type junction so as to optimise the collection of photogenerated changes by absorption of photons in the space charge zone.

Thus, an undoped or slightly doped intermediate region 29 is preferably formed between the first doped region 25 and the second doped region 27 that will act as a depletion zone.

The slightly doped region can be a region doped by at least one electron acceptor species and at least one electron donor species, the two types of species being compensated so as to create a weak N or P type global doping. "Weak" or "slightly doped" means that the concentration of the majority species is between $10^{14}$ and $10^{16}$ cm$^{-3}$.

The second doped region 27 is chosen to have a concentration typically between 1e17 and 1e19/cm$^3$, and preferably between 1e18 and 5e18/cm$^3$.

Figure 4A:
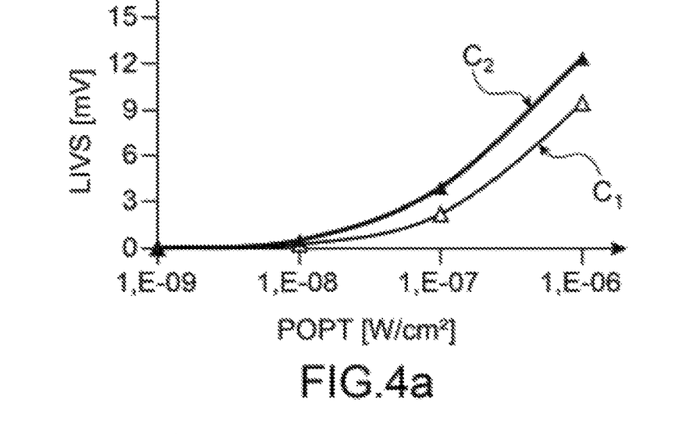
FIGS. 4A-4B illustrate differences in performances in light-induced V shift (LIVS) of threshold voltages between a photosensitive device with a 2D junction like that shown in FIG. 1 and a photosensitive device with a 3D junction like that shown in FIGS. 3A-3C.

On FIG. 4A, curves $C_1$ and $C_2$ are representative of variations of the LIVS parameter as a function of the received optical power and illustrate the performances of a photosensitive structure with a NIP junction of the "2D" type as illustrated on FIG. 1 and a structure according to the invention with a NIP junction of the "3D" type as illustrated on FIG. 2. For both of these example structures, the insulating layer 11 of the substrate is made of silicon oxide and its thickness is of the order of 25 nm. The transistor has a gate with length Lg equal to the order of 60 nm, and a width W of 1000 nm. The thickness Tn of the N doped region located under the BOX is of the order of 150 nm while the thickness Ti of the slightly doped type I region 29 is of the order of 100 nm (the thicknesses Ti, Tn being dimensions measured parallel to the z axis.

Figure 4B:
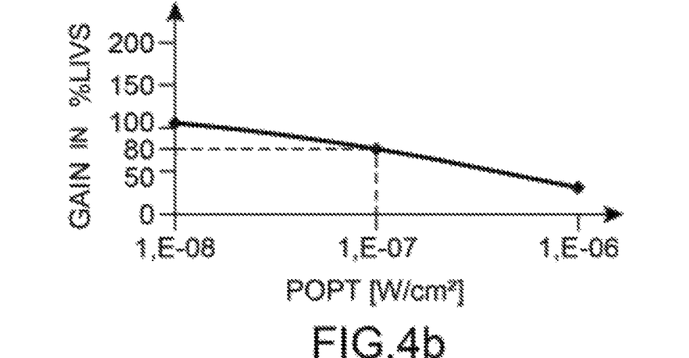

As illustrated on FIG. 4B, a structure with a 3D junction according to the invention can give a gain of LIVS performances of the order of 80% compared with structure with a 2D junction, at low intensity of the order of 1e-7 W/cm$^2$.

Concentrations of dopants in the first doped region 25 formed facing the channel zone can be increased to improve the performances of a structure with a 3D junction as described above.

Figure 5:
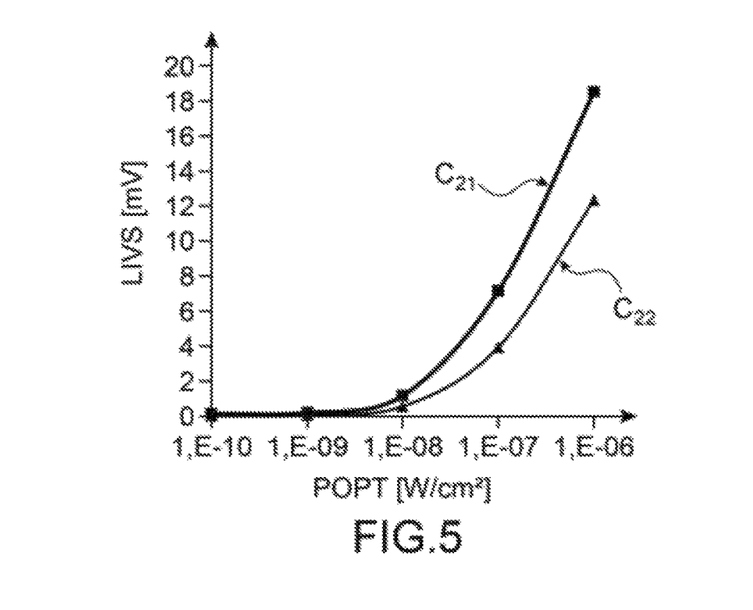
FIG. 5 illustrates differences in LIVS performances between two photosensitive devices with a 3D junction with different doping levels of the first doped region of the photosensitive zone.

On FIG. 5, curves $C_{21}$ and $C_{22}$ are representative of the variation of the LIVS parameter as a function of the light intensity for "3D" type photosensitive structures with a NIP junction according to the invention, with a concentration of dopants of the order of 1.75e18/cm³ and with a concentration of dopants of the order of 1e19/cm³ respectively in the first doped region 25. Such an increase in the concentration of dopants can give a gain in the LIVS of the order of 80% for an intensity of the order of 1e-7 W/cm².

Figure 6A:
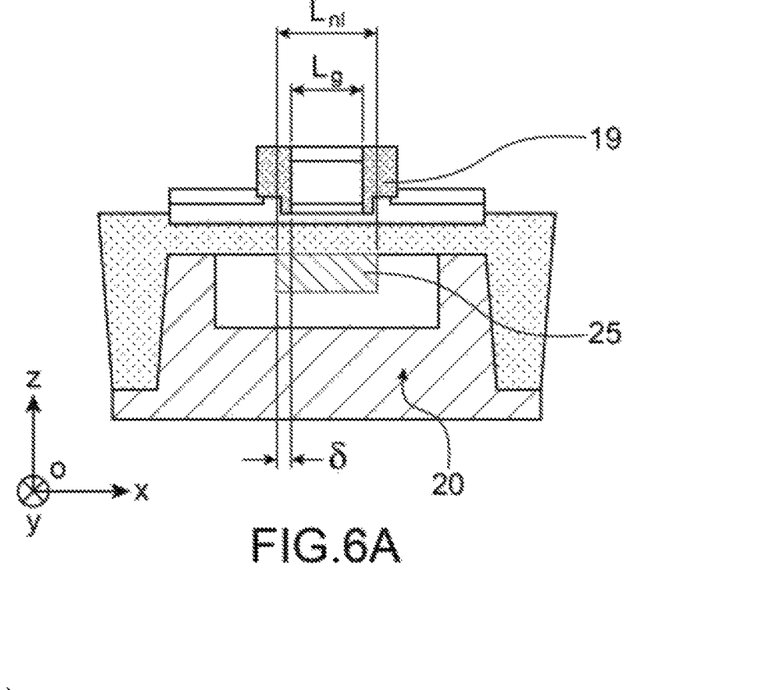
FIGS. 6A-6B illustrate a variant embodiment of the device with a 3D junction according to the invention formed from a doped zone that extends facing the transistor channel and gate, the lateral limits of which are facing the spacers.

The detection sensitivity can also be improved by using a variant embodiment as illustrated on FIG. 6A in which the first region 25 is doped with a critical dimension $L_{n1}$ in this case selected to be slightly larger than the gate length Lg of the transistor $T_1$.

"Slightly larger" means that the projection δ beyond the gate length is less than 40 nm and less than the thickness of the spacers 19. Thus, the critical dimension $L_{n1}$ is chosen to be less than the predetermined total length $L_{max}$ equal to the gate length Lg plus an accumulated thickness 2*ds of spacers 19 located on each side of the gate 18. The thickness of the spacers 19 and the gate length Lg are dimensions measured parallel to the x axis of the [O; x; y; z] coordinate system. In other words, the critical dimension $L_{n1}$ is chosen such that $Lg \leq L_{n1} < Lg + 2*ds$.

For a gate with a dimension equal for example to the order of 30 nm, the projection δ may for example be chosen to be of the order of 60 nm.

Figure 6B:
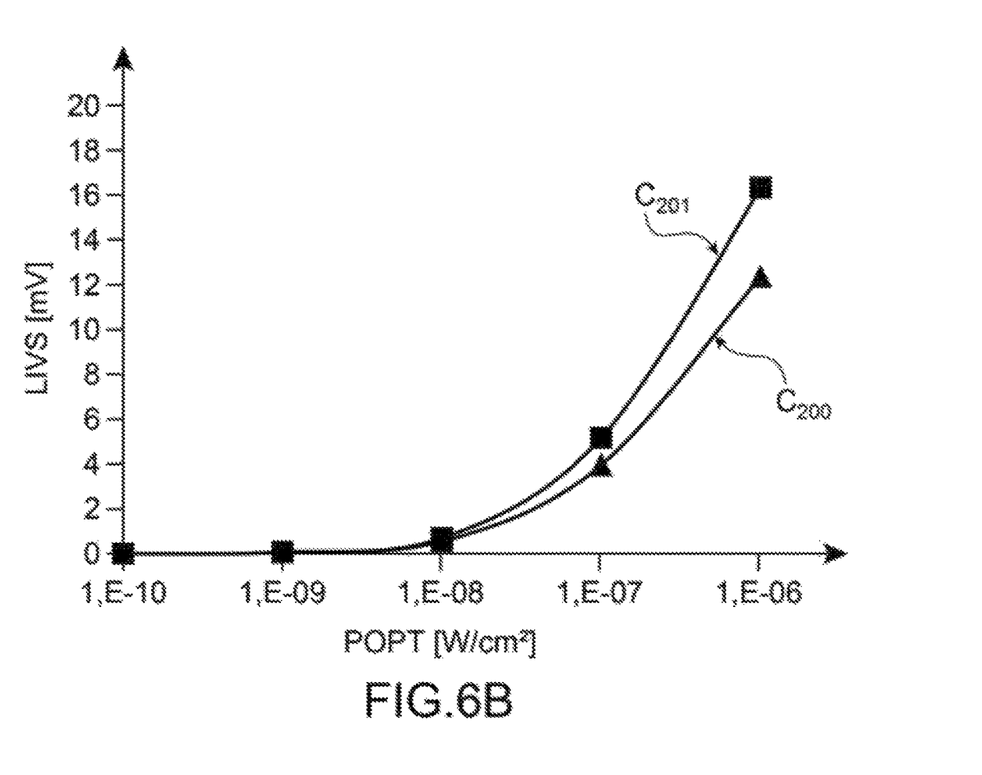

On FIG. 6B, the curves $C_{200}$ and $C_{201}$ are representative of the variation of the LIVS parameter as a function of the light intensity for photosensitive structures according to the invention with a critical dimension $L_{n1}$ of the first doped region 25 equal to the length Lg of the transistor gate $T_1$, and equal to Lg+60 nm respectively. Such an adjustment of the projection δ can give a gain of the order of 30% of the LIVS for an intensity of the order of 1e-7 W/cm².

Figure 7A:
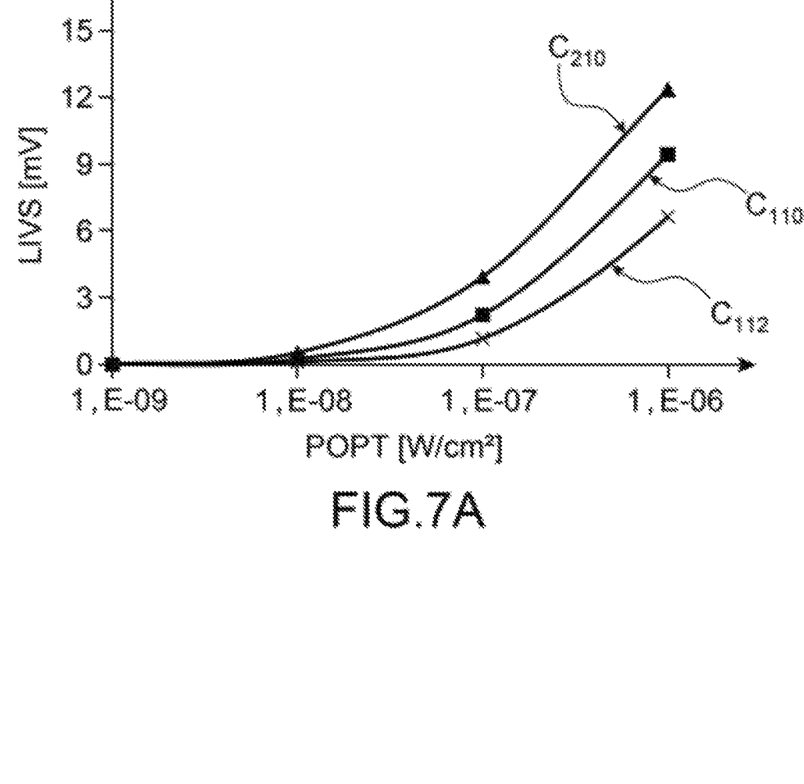
FIGS. 7A-7B illustrate differences in sensitivity between a photosensitive device with a 3D junction as used in the invention and other types of arrangements.
Figure 7B:
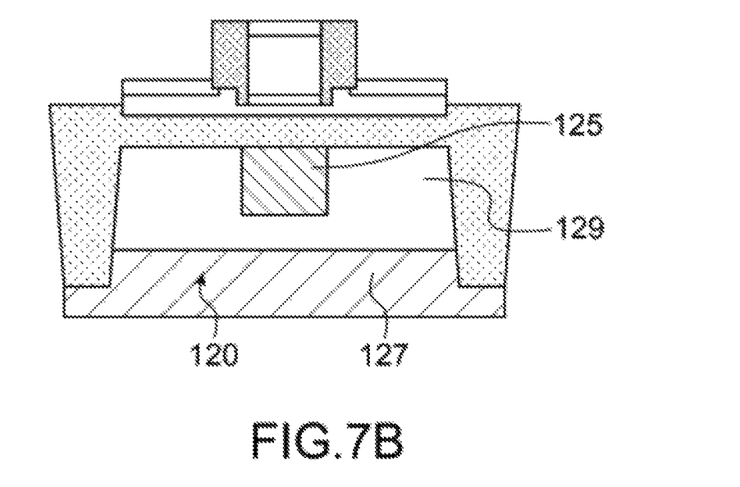

On FIG. 7A, the curves $C_{110}$, $C_{210}$, and $C_{112}$ are representative of the variation of the LIVS parameter as a function of the light intensity for a photosensitive structure with a "2D" type junction as illustrated on FIG. 1, for a "3D" structure according to the invention and for a structure with a photosensitive zone 120 qualified as "2.5D" as illustrated on structure FIG. 7B, respectively. They show the improved sensitivity obtained using the 3D arrangement of the junction.

In the 2.5D arrangement in FIG. 7B, the photosensitive zone 120 is formed from a first doped region 125 facing the transistor gate, for example N doped completely surrounded by a slightly doped or undoped type I region 129 located on a P doped layer 127.

Steps in a method of fabricating a photosensitive device of the type described above are illustrated on FIGS. 8A-8D.

Figure 8A:
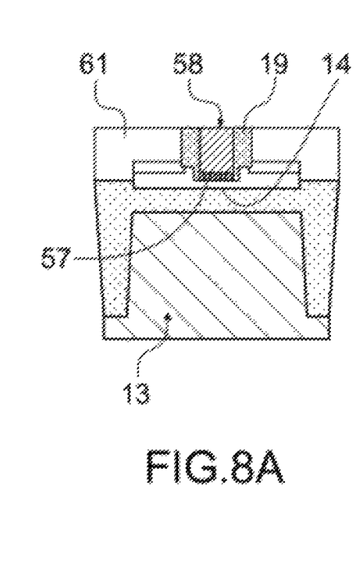
FIGS. 8A-8D illustrate steps in a first example of a method of making a photosensitive device according to the invention.

The photosensitive device is made from a semiconductor on insulator type substrate like that mentioned above with a surface semiconducting layer 12 made of silicon. The semiconducting support layer 10 may also be made of silicon.

This support layer 10 may be doped with a given doping type, for example using an accepting species, in order to make a well 13 with P type doping. A P-type Well 13 can be formed in the support layer 10 by making a boron implantation with an energy typically between 30 keV and 250 keV, preferably between 120 keV and 200 keV, and a dose typically between 1e12 cm⁻² and 1e14 cm⁻², and preferably between 1.2e12 cm⁻² and 4e13 cm⁻². As a variant, an indium implantation may be used.

One step in the method illustrated on FIG. 8a consists of making a "sacrificial" gate 58 from a transistor for which the channel is placed in the surface layer 12. For example, the sacrificial gate 58 is made from amorphous silicon or polysilicon and rests on a dielectric layer 57, for example made of $SiO_2$, itself supported on a zone 14 of the surface layer 12 in which the channel is located.

An encapsulation layer 61 is formed around the sacrificial layer 58. The encapsulation layer 61 is typically an oxide layer deposited on the gate then planarised using the CMP (Chemical Mechanical Planarisation) method so as to remove a thickness from this layer and expose the top face of the sacrificial gate 58. The encapsulation layer 61 may be placed around and in contact with insulating spacers 19, for example made from silicon nitride, themselves arranged in contact with the lateral flanks of the sacrificial gate 58. When a hard mask is provided on the sacrificial gate, this hard mask can be removed selectively with regard to the material of the encapsulation layer. Such a selective removal may for example be made with orthophosphoric acid when the hard mask is made of silicon nitride and the encapsulation layer is made of silicon oxide.

The sacrificial gate 58 is then removed so as to make an opening 63 in the form of the sacrificial gate 58. This removal may for example be made by etching using nitric acid or a TMAH (Tetramethylammonium hydroxide) base when the sacrificial gate 58 is made of polysilicon.

Advantageously, at this stage of the method, the dielectric layer 57 is kept that can then be used as a protective layer for the channel zone 14.

A portion 25 of the support layer 10 facing the opening 63 and consequently the channel zone 14 is then doped by implantation. In the case illustrated on FIG. 8B in which the well 13 already made in the support layer 10 is P doped, this implantation can be made using a donor species so as to dope a portion 25 with a doping opposite the doping of the well 13, in this case an N type doping.

Figure 8B:
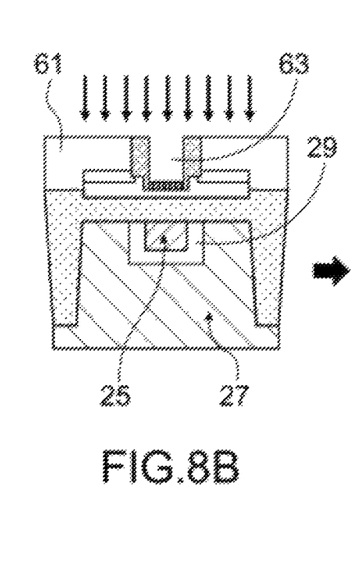

The N doped portion 25 forms the first doped region of the junction and can be surrounded by a slightly doped intermediate region 29 surrounding this first region 25.

The dimensions of the first region 25 in a plane parallel to the principal plane of the substrate thus depend on the dimensions of the opening 63 and therefore of the removed sacrificial gate.

The N type doping may for example be made using phosphorus at an implantation energy typically between 10 keV and 200 keV, preferably between 35 keV and 110 keV, at a dose typically between 1e12 cm⁻² and 1e14 cm⁻², and preferably between 1.2e13 cm⁻² and 4e13 cm⁻².

Another example embodiment consists of an implantation of arsenic at an energy that may be between 10 keV and 200 key, preferably between 80 keV and 110 keV, with a dose typically between 1e12 cm⁻² and 1e14 cm⁻², and preferably between 5e12 cm⁻² and 5e13 cm⁻². When the gate dielectric layer 57 is kept, it can protect the channel zone 14 during the implantation. The portions of the doped well 13 that keep globally P type doping form the second doped region 27 surrounding the intermediate regions 29.

Figure 8C:
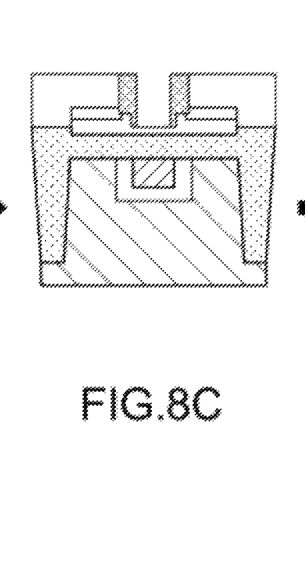

The dielectric layer 57 is removed in a subsequent step illustrated on FIG. 8C. This removal may be done by selective etching with regard to the material of the encapsulation layer 61 and the spacers, for example etching with dilute hydrofluoric acid (HF).

Figure 8D:
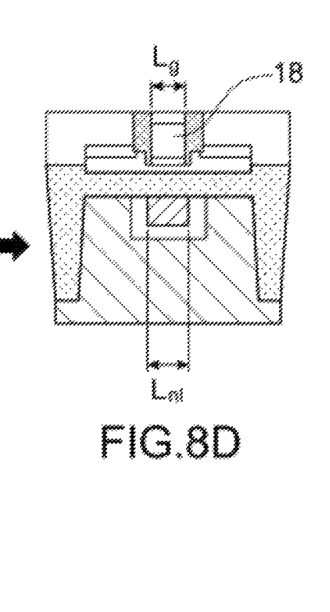

A replacement gate 18 may then be formed by depositing a gate dielectric and then a gate material in the opening 63.

The dimensions of the gate in a plane parallel to the principal plane of the substrate correspond to the dimensions of the previously removed sacrificial gate. Thus, in a plane parallel to the principal plane of the substrate, in particular the first region 25 has a critical dimension Ln1 that is approximately the same as the length Lg of the gate 18.

The example method described above relates to the fabrication of a PIN or PN junction with an N doped region 25 embedded in a P doped region 27.

As a variant, an NIP or an NP junction can be made with an N doped region 25 embedded in a P doped region 27.

To achieve this, an N type well is made, for example by making an implantation using phosphorus at an energy typically between 100 keV and 300 key, preferably between 155 keV and 240 key, at a dose typically chosen between 1e12 cm$^{-2}$ and 1e14 cm$^{-2}$, and preferably between 1.2e12 cm$^{-2}$ and 4e13 cm$^{-2}$.

In this case, the implantation described above with reference to FIG. 8B is an implantation of an accepting species so as to form a first P doped region 25. A P doped region 25 is made for example by an indium-based implantation at an energy of between 100 keV and 300 keV, preferably between 130 keV and 200 keV, with a dose typically between 1e12 cm$^{-2}$ and 1e14 cm$^{-2}$, preferably between 5e12 cm$^{-2}$ and 5e13 cm$^{-2}$.

According to another example, a P-type doping of the region 25 is made using an implantation based on boron with energy typically between 1 keV and 5 keV, preferably between 10 keV and 40 keV, at a dose typically chosen between 1e12 cm$^{-2}$ and 1e14 cm$^{-2}$, and preferably between 5e12 cm$^{-2}$ and 5e13 cm$^{-2}$.

Another example of the method, unlike the previous example, includes fabrication of the transistor gate before forming the junction.

Figure 9A:
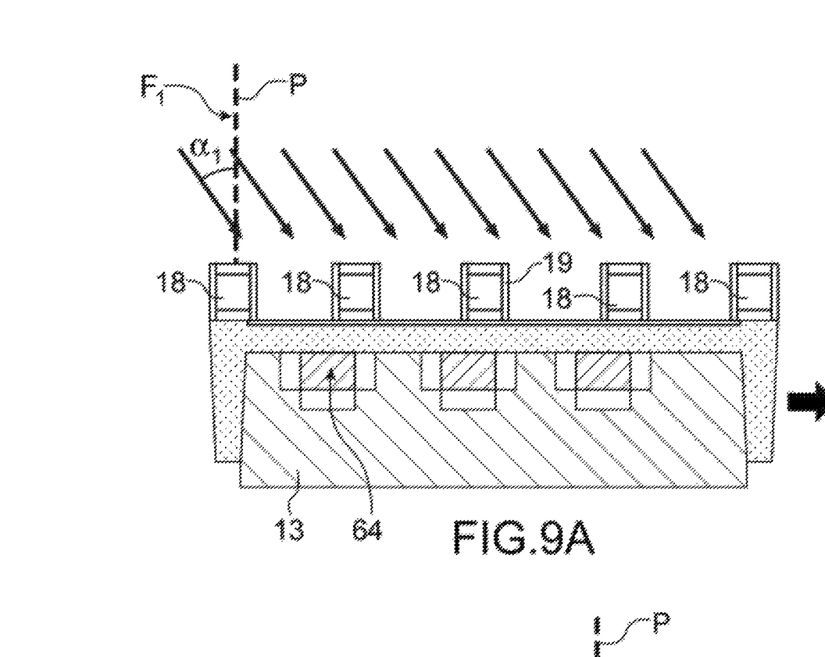
FIGS. 9A-9C illustrate steps in a second example of a method of making a photosensitive device according to the invention.

In the example illustrated on FIG. 9A, several transistor gates 18 are made facing a P doped well 13 formed in the support layer of a semiconductor on insulator substrate. The lateral flanks of the gates 18 are typically covered with insulating spacers 19.

The first step is to make an N type doping of portions 64 of the support layer 10 located under the corresponding gates 18. As illustrated on FIG. 9A, this is done by making at least one implantation inclined at an angle $\alpha_1$ from a first face $F_1$ of a given plane P orthogonal to the principal plane of the substrate that extends in the direction of the width W of the gate (in other words in a direction parallel to they axis on FIG. 11A). The implantation is made using a first doping species, an electron accepting species in the example in FIG. 11A.

The angle $\alpha_1$ is chosen as a function of the gate dimensions. Typically, an implantation angle $\alpha_1$ equal to between 0 and 40° is chosen.

Figure 9B:
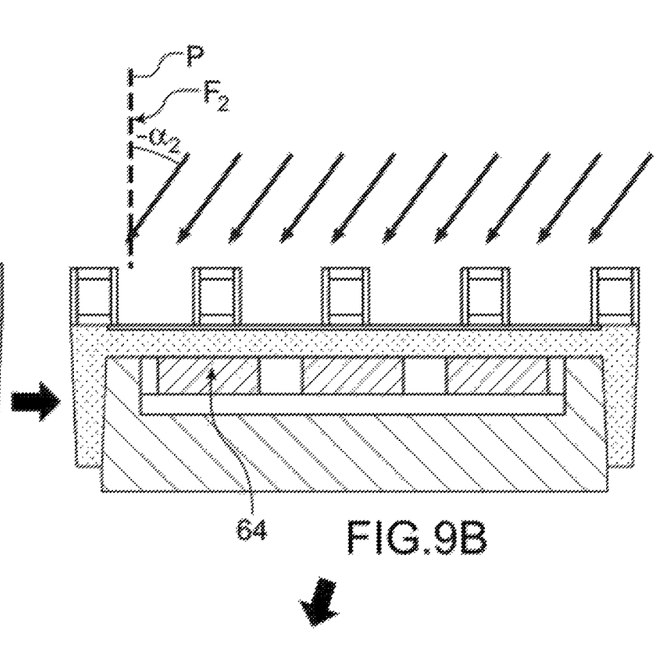

The next step is at least one other implantation inclined at an angle $-\alpha_2$ relative to a face $F_2$ of the given plane P opposite the first face $F_1$. Preferably, the angles $\alpha_1$ and $\alpha_2$ are chosen to be equal such that the implantation beams are symmetric about the plane P. The N type doped portions are thus widened such that they are entirely facing the gates 18. Typically, $0<\alpha_1<40°$.

Figure 9C:
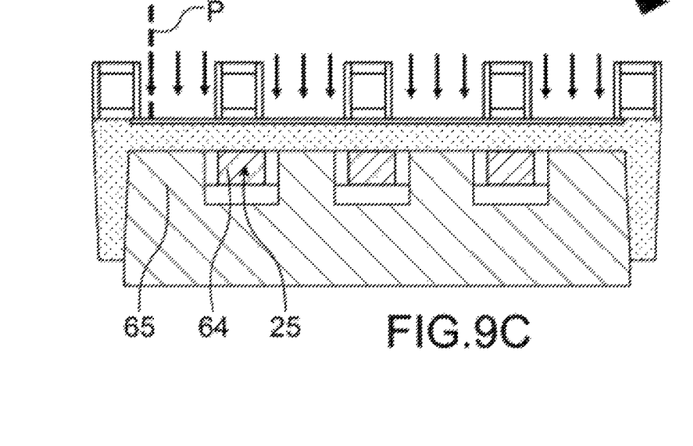

The next step is a vertical implantation, in other words in this case it is parallel to the given plane P.

Doping is done using a second doping species that is an electron donor species when the first doping species is an electron accepting species, and an electron accepting species when the first doping species is an electron donor species.

In the example illustrated on FIG. 9C, a P type implantation is made so as to shrink the portions 64 doped with N type doping and form a P type doping around the doped portions 65. Doping may be similar to doping done to make the P-doped well 13, but with a lower implantation energy.

In this example, the first doped region 25 of the photosensitive zone is formed from the N doped portion 64 while the second doped region 27 is formed from implanted portions 65 and the P doped well.

Figure 10A:
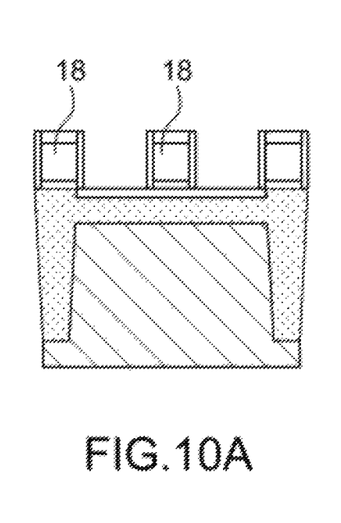
FIGS. 10A-10C illustrate steps in a third example of a method of making a photosensitive device according to the invention.
Figure 10B:
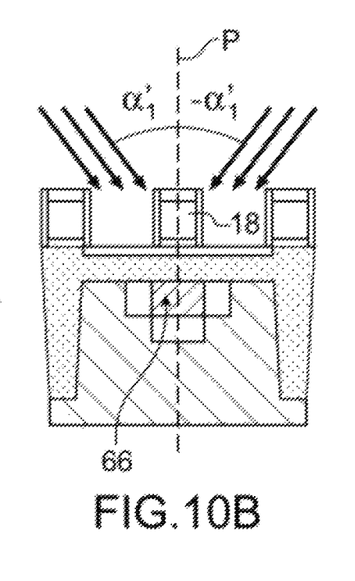
Figure 10C:
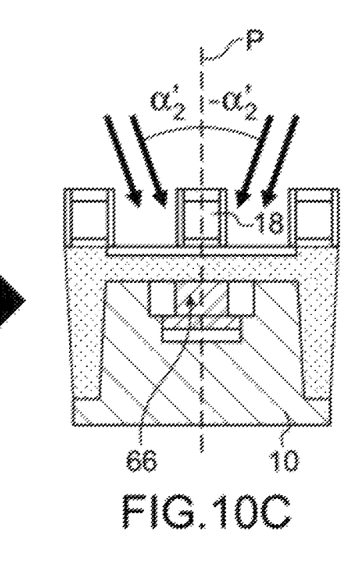

Another example method of making the photosensitive zone is illustrated on FIGS. 10A-10C.

The first step is to form one or several transistor gates 18 (FIG. 10A).

The first implantations are then made inclined at angles $\alpha'_1$ and $-\alpha'_1$ respectively from a given plane P orthogonal to the principal plane of the substrate, and that extends in the direction of the width of the gate 18. For example, the angle $\alpha'_1$ may be of the order of 30°.

A portion 66 of the support layer 10 located facing the gate 18 is doped in this way, and an N type doping is made on this portion 66 (FIG. 10B).

Then, other implantations are made inclined at smaller angles $\alpha'_2$ and $-\alpha'_2$ from plane P, such that $\alpha'_2<\alpha'_1$. For example, $\alpha'_2$ may be of the order of 0 to 30°

These other implantations are typically made with a higher implantation energy than that used to make the first implantations. They can reinforce doping and increase the depth of the N doped portion 66 in the support layer 10.

Figure 11A:
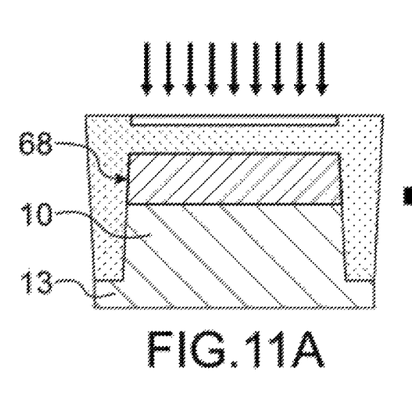
FIGS. 11A-11C illustrate steps in a fourth example of a method of making a photosensitive device according to the invention.

Another embodiment of the photosensitive zone consists of forming a vertical PN or NP junction before forming one or several transistor gates 18.

This can be done starting from a semiconductor on insulator substrate comprising a doped well 13 in the support layer 10, the well for example having a P type doping.

The next step is an ion implantation so as to dope an upper underlayer 68 of the support layer 10 (FIG. 11A). The upper underlayer 68 is arranged in contact with the insulating layer 11 and extends parallel to the principal plane of the substrate. The doping made is of the type opposite the doping of the doped well 13. "Opposite type of doping" means that the upper underlayer 68 is doped with an N type doping when the well 13 is P doped (and conversely that the upper underlayer 68 is doped with a P type doping when the well 13 is N doped).

Figure 11B:
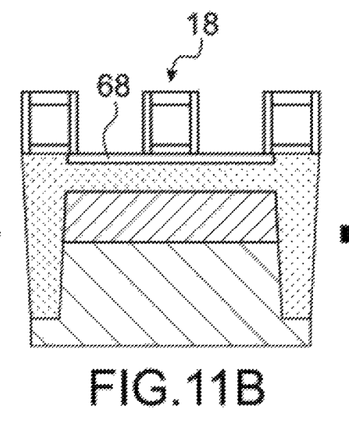

A step is then done to form at least a transistor gate 18 on the surface semiconducting layer 12 of the substrate (FIG. 11B).

Figure 11C:
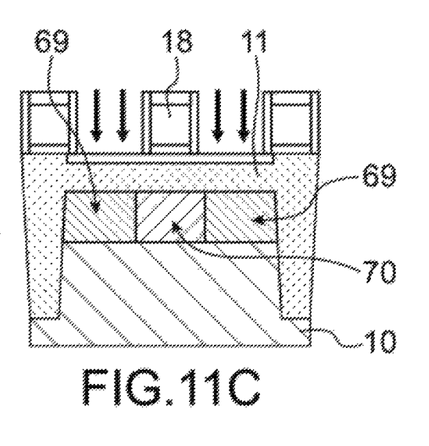

An implantation is then made on each side of the gate 18 so as to dope portions 69 of the support layer located in contact with the insulating layer 11 with the opposite type of doping to that done previously to dope the upper sub-layer 68.

Thus, when the upper underlayer 68 is N doped, the portions 69 are P doped. These portions 69 are N doped when the upper underlayer 68 is P doped (FIG. 11C).

An N doped portion 70 located under the gate 18 and protected by this gate during the implantation keeps the same doping as that initially made in the upper layer 68, for example N type doping when the portions 69 are P doped.

Semiconductor blocks can then be formed on the surface layer 12 on each side of the gate 18 so as to form source and drain regions facing the P doped portions 69.

Figure 12A:
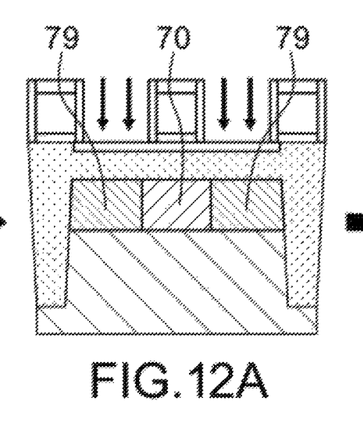
FIGS. 12A-12B illustrate a variant embodiment of the fourth example method.

As a variant to the step described above with reference to FIG. 11C, the upper underlayer 68 can be implanted so as to make slightly doped portions 79, while keeping an N doped portion 70 under the gate 18 (FIG. 12A). Thus, P doping is done so as to compensate for the initial N doping, to form slightly doped portions 79.

At least one other implantation is then done so as to make P type doping or increase the P doping of the parts 83 of slightly doped portions 79.

Figure 12B:
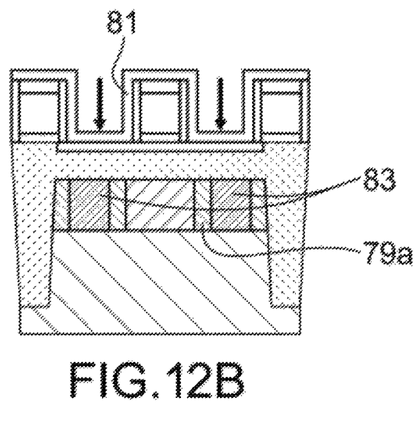

This other implantation is preferably implemented using a masking layer 81, particularly arranged in contact with the flanks of the gate. This masking layer may for example be based on silicon nitride (preferably deposited by a conforming deposition method such as ALD (Atomic Layer Deposition) to protect slightly doped zones 79a of the support layer located between the N doped portion 70 located facing the gate and the P doped parts 83 located on each side of this N doped portion (FIG. 12B).

The invention claimed is:

1. A photosensitive device comprising a semiconductor on an insulator substrate with at least a transistor on said substrate, the substrate being provided with a surface semiconducting layer in which a channel zone of said transistor is arranged, an insulating layer separating the surface semiconducting layer from a semiconducting support layer, the semiconducting support layer comprising a photosensitive zone formed from regions doped with at least one first doping type, N or P, and at least one second doping type, P or N, so as to form at least one junction, the insulating layer being configured so as to enable capacitive coupling between the photosensitive zone and the transistor channel zone, the photosensitive zone comprising the following, among said doped regions:

a first doped region doped with a first type of doping, the first doped region being arranged in contact with the insulating layer and facing the channel zone, and a second doped region doped with a second type of doping, the second doped region being arranged around the first doped region and extending in contact with the insulating layer and facing source and drain zones of the transistor, wherein the insulating layer and the first doped region are in contact at a first contact zone, the first contact zone between said insulating layer and said first doped region extends opposite the channel of the transistor, the insulating layer being located between the first contact zone and the transistor channel zone, the insulating layer and the second doped region are in contact at second contact zones, and the second contact zones between said insulating layer and said second doped zones extend opposite the source and drain regions of the transistor, the insulating layer being located between the second contact zones and the source and drain regions.

2. The photosensitive device according to claim 1, the second doped region further extending under the first doped region such that facing the channel zone, the first doped region is located between the insulating layer and the second doped region.

3. The photosensitive device according to claim 1, wherein the transistor channel zone is entirely facing the first doped region.

4. The photosensitive device according to claim 1, wherein, in a cross section of the semiconducting support layer, the first doped region is entirely surrounded by said second doped region.

5. The photosensitive device according to claim 1, comprising:

a transistor gate formed on the semiconductor on insulator substrate, the semiconducting support layer doped with impurities of the first doping type implanted at an angle $\alpha_1$ and at an angle $-\alpha_2$ respectively from a given plane orthogonal to the principal plane of the substrate, so as to form a first portion facing the gate, and the semiconducting support layer having second portions with the second doping type respectively disposed on each side of the first portion.

6. The photosensitive device according to claim 1, comprising:

a transistor gate formed on the semiconductor on insulator substrate, a portion of the semiconductor support layer under the gate doped with a first type of impurities implanted inclined by angles $\alpha_1$ and $-\alpha_1$ respectively from a given plane orthogonal to the principal plane of the substrate, and doped with the first type of impurities implanted inclined by angles $\alpha_2$, $-\alpha_2$ respectively such that $\alpha_2 < \alpha_1$ from a given plane.

7. The photosensitive device according to claim 1, comprising:

a gate, the semiconducting support layer having an underlayer doped with the first doping type, and portions of the semiconducting support layer located on each side of a central portion of the semiconducting support layer located facing the gate and doped with the second doping type.

8. The photosensitive device according to claim 7, wherein each of said portions has a first part with higher doping concentration than that of a second part of said portions.

9. A photosensitive device, comprising a semiconductor on an insulator substrate with at least a transistor on said substrate, the substrate being provided with a surface semiconducting layer in which a channel zone of said transistor is arranged, an insulating layer separating the surface semiconducting layer from a semiconducting support layer, the semiconducting support layer comprising a photosensitive zone formed from regions doped with at least one first doping type, N or P, and at least one second doping type, P or N, so as to form at least one junction, the insulating layer being configured so as to enable capacitive coupling between the photosensitive zone and the transistor channel zone, the photosensitive zone comprising the following, among said doped regions:

a first doped region doped with a first type of doping, the first doped region being arranged in contact with the insulating layer and facing the channel zone, and a second doped region doped with a second type of doping, the second doped region being arranged around the first doped region and extending in contact with the insulating layer and facing source and drain zones of the transistor, wherein a slightly doped intermediate region is located between said first doped region and said second doped region, and the first doped region, the intermediate region, and the second doped region form a PIN or NIP type junction and are distributed concentrically around a given zone of the semiconducting support layer entirely located facing the transistor channel zone and in contact with the insulating layer.

10. A photosensitive device, comprising a semiconductor on an insulator substrate with at least a transistor on said substrate, the substrate being provided with a surface semiconducting layer in which a channel zone of said transistor is arranged, an insulating layer separating the surface semiconducting layer from a semiconducting support layer, the semiconducting support layer comprising a photosensitive zone formed from regions doped with at least one first doping type, N or P, and at least one second doping type, P or N, so as to form at least one junction, the insulating layer being configured so as to enable capacitive coupling between the photosensitive zone and the transistor channel zone, the photosensitive zone comprising the following, among said doped regions:
a first doped region doped with a first type of doping, the first doped region being arranged in contact with the insulating layer and facing the channel zone, and
a second doped region doped with a second type of doping, the second doped region being arranged around the first doped region and extending in contact with the insulating layer and facing source and drain zones of the transistor,
wherein the transistor is provided with a gate, the first doped region being delimited laterally by lateral edges facing insulating spacers arranged in contact with the gate.

* * * * *